US011980080B2

(12) United States Patent
Jiang

(10) Patent No.: US 11,980,080 B2
(45) Date of Patent: May 7, 2024

(54) DISPLAY TERMINAL AND DISPLAY DEVICE APPLIED IN DISPLAY TERMINAL

(71) Applicant: WUHAN CHINA STAR OPTOELECTRONICS SEMICONDUCTOR DISPLAY TECHNOLOGY CO., LTD., Wuhan (CN)

(72) Inventor: Qian Jiang, Wuhan (CN)

(73) Assignee: WUHAN CHINA STAR OPTOELECTRONICS SEMICONDUCTOR DISPLAY TECHNOLOGY CO., LTD., Wuhan (CN)

( * ) Notice: Subject to any disclaimer, the term of this patent is extended or adjusted under 35 U.S.C. 154(b) by 510 days.

(21) Appl. No.: 17/280,885

(22) PCT Filed: Dec. 3, 2020

(86) PCT No.: PCT/CN2020/133539
§ 371 (c)(1),
(2) Date: Mar. 27, 2021

(87) PCT Pub. No.: WO2022/095183
PCT Pub. Date: May 12, 2022

(65) Prior Publication Data
US 2023/0121461 A1    Apr. 20, 2023

(30) Foreign Application Priority Data
Nov. 6, 2020  (CN) .......................... 202011230918.7

(51) Int. Cl.
G02F 1/1333    (2006.01)
H10K 59/80    (2023.01)
(Continued)

(52) U.S. Cl.
CPC ......... *H10K 59/873* (2023.02); *H10K 77/111* (2023.02); *G02F 1/133305* (2013.01); *G02F 1/133388* (2021.01); *H10K 59/12* (2023.02)

(58) Field of Classification Search
CPC ............. G02F 1/1333; G02F 1/133305; G02F 1/133388; G06F 1/1605; G06F 1/1652;
(Continued)

(56) References Cited

U.S. PATENT DOCUMENTS

2020/0352046 A1    11/2020  Kim
2022/0115473 A1*   4/2022   Han ..................... H10K 50/844
2022/0244456 A1*   8/2022   Su .......................... G06F 1/1637

FOREIGN PATENT DOCUMENTS

CN    104662489 A    5/2015
CN    106030687 A    10/2016
(Continued)

OTHER PUBLICATIONS

Chinese Office Action issued in corresponding Chinese Patent Application No. 202011230918.7 dated Jun. 15, 2021, pp. 1-9.
(Continued)

*Primary Examiner* — Thoi V Duong
(74) *Attorney, Agent, or Firm* — PV IP PC; Wei Te Chung; Zhigang Ma

(57) ABSTRACT

A display terminal and a display panel applied in the display terminal are disclosed in the present application. Widths of the non-display areas of the display panel are elongated to fix the non-display areas to a non-display surface of the display terminal, to achieve a bezel-free display effect on two sides of the display terminal in an unfolded state, and a seamless surround display effect and a bezel-free display effect on the two sides of the display terminal in a folded state.

20 Claims, 9 Drawing Sheets

(51) Int. Cl.
*H10K 77/10* (2023.01)
*H10K 59/12* (2023.01)

(58) Field of Classification Search
CPC ......... G09F 9/301; G09F 9/33; H10K 59/873; H10K 59/12; H10K 77/111; Y02E 10/549
See application file for complete search history.

(56) References Cited

FOREIGN PATENT DOCUMENTS

| | | |
|---|---|---|
| CN | 207410370 U | 5/2018 |
| CN | 108172124 A | 6/2018 |
| CN | 208207775 U | 12/2018 |
| CN | 109428952 A | 3/2019 |
| CN | 110035155 A | 7/2019 |
| CN | 209087914 U | 7/2019 |
| CN | 110794923 A | 2/2020 |
| CN | 110993828 A | 4/2020 |
| CN | 111179751 A | 5/2020 |
| CN | 111261642 A | 6/2020 |
| CN | 111596781 A | 8/2020 |

OTHER PUBLICATIONS

International Search Report in International application No. PCT/CN2020/133539, dated Jul. 26, 2021.
Written Opinion of the International Search Authority in International application No. PCT/CN2020/133539, dated Jul. 26, 2021.

* cited by examiner

DISPLAY TERMINAL AND DISPLAY DEVICE APPLIED IN DISPLAY TERMINAL

RELATED APPLICATIONS

This application is a Notional Phase of PCT Patent Application No. PCT/CN2020/133539 having international filing date of Dec. 3, 2020, which claims the benefit of priority of Chinese Patent Application Nos. 202011230918.7 filed on Nov. 6, 2020. The contents of the above applications are all incorporated by reference as if fully set forth herein in their entirety.

FIELD OF INVENTION

The present application relates to the field of display technology, and particularly to a display terminal and a display panel applied in the display terminal.

With the rapid development of display technology, terminal products with a display function are developed in a direction of foldability, full screen, and light weight. Organic light-emitting diode (OLED) display devices have become representatives of a new generation of planar display technologies due to their advantages of self-illumination, high contrast, thin thickness, wide viewing angles, and fast response speed, and they have been gradually introduced into the field of flexible display technology. However, at present, flexible OLED display technology is not mature enough, and there are still many aspects to be improved and optimized.

Now, as shown in FIG. 1 and FIG. 2, a flexible OLED display panel includes a carrier substrate 1. The carrier substrate 1 is divided into a display area 2 and a non-display area 3. The non-display area 3 is disposed around the display area 2. Wherein, the display area 2 consists of a first display sub-area 21 and a second display sub-area 22 connected to each other. The non-display area 3 consists of a first non-display sub-area 31, a second non-display sub-area 32, a third non-display sub-area 33, and a fourth non-display sub-area 34 connected in sequence. The flexible OLED display panel can be folded along a M/N direction, wherein each of the non-display sub-areas has a thickness W of at least 1.0 millimeter. Of course, the flexible OLED display panel can also be folded along a horizontal direction perpendicular to the M/N direction, and the positions of the first display sub-area 21 and the second display sub-area 22 can be adaptively adjusted, which is not described in detail herein.

SUMMARY OF INVENTION

In prior art, the above-mentioned flexible OLED display panels are applied to terminal products in the following three ways. The first application is shown in FIG. 3, the folded part of the flexible OLED display panel is located on the right side, after the flexible OLED display panel is folded, the display area 2 and the non-display area 3 are located on the outer side, and the substrate 1 is located on the inner side. The flexible OLED display panel located on both sides of the folded part are asymmetrically configured. The flexible OLED display panel can be folded dynamically with the terminal product. The second application is shown in FIG. 4, the folded part of the flexible OLED display panel is located on the right side, after the flexible OLED display panel is folded, the display area 2 and the non-display area 3 are located on the inner side, and the substrate 1 is located on the outer side. The flexible OLED display panel locates on both sides of the folded part are symmetrically configured. The flexible OLED display panel can be folded dynamically with the terminal product. The third application is shown in FIG. 5, the flexible OLED display panel has two folded parts located on the right side and the left side respectively, after the flexible OLED display panel is folded, the display area 2 and the non-display area 3 are located on the outer side, and the substrate 1 is located on the inner side. The flexible OLED display panel is static folded.

As to the first application and the second application, the flexible OLED display panel is a large-size screen in unfolded state, which has disadvantages of difficult in fulfilling extremely narrow border and great width of the non-display area. Moreover, it is difficult to reduce the width of non-display area with existing technologies. In addition, there is room to optimize the screen-to-body ratio of the left area in the first application and the second application. In the third application, there is room to optimize the vacancy 100 in the FIG. 5.

A display terminal and a display panel applied in the display terminal are provided by the embodiments of the present application to solve the problems of difficult to fulfill extremely narrow border, large width of non-display area and unsatisfactory screen-to-body ratio existing in the foldable display terminal products in prior art.

In one aspect, a display terminal is provided in the present application, comprising:

a terminal main body comprising a display surface and a non-display surface disposed oppositely and a first blending surface and a second blending surface disposed oppositely, wherein a bending portion is correspondingly configured in each of the display surface and the non-display surface, two ends of the display surface are connected with two ends of the non-display surface by the first blending surface and the second blending surface respectively, and a first groove and a second groove are provided in the two ends of the non-display surface respectively; and a display panel comprising a display area, and a first non-display area and a second non-display area located on edges of both ends of the display area disposed oppositely, wherein the first non-display area and the second non-display area are disposed in the first groove and the second groove of the terminal main body respectively, and the display area covers the display area, the first blending surface and the second blending surface of the terminal main body.

In some embodiments of the present application, the bending portions are configured in the middle of the display surface and the middle of the non-display surface to optimize the screen-to-body ratio.

In some embodiments of the present application, the first blending surface and the second blending surface are symmetrical to the bending portion, and the first groove and the second groove are symmetrical to the bending portion to optimize the screen-to-body ratio.

In some embodiments of the present application, both the first blending surface and the second blending surface are arc surfaces to fulfill seamless connection of the first blending surface and the second blending surface.

In some embodiments of the present application, an end corner at the junction of the non-display surface and the first blending surface and an end corner at the junction of the non-display surface and the second blending surface are rounded corners to prevent sharp edges and corners from hurting the display panel itself, people, or objects.

In some embodiments of the present application, the display area of the display panel extends from the first blending surface and the second blending surface to close to an edge of the first groove and an edge of the second groove to achieve a seamless surround display effect, while avoiding problems of significant heat generation and significant temperature rise which the large overlap causes the display panel in the overlapping area due.

In some embodiments of the present application, a depth of the first groove equals a depth of the second groove, and both the depth of the first groove and the depth of the second groove are less than an overall thickness of the display terminal.

In some embodiments of the present application, both the depth of the first groove and the depth of the second groove are at least greater than the overall thickness of the display panel.

In a second aspect, a display panel is provided by the present application, the display panel is applied in a display terminal, wherein the display terminal further comprises a terminal main body comprising a display surface and a non-display surface disposed oppositely, and a first blending surface and a second blending surface disposed oppositely, wherein a bending portion is correspondingly configured in each of the display surface and the non-display surface, both ends of the display surface are connected with both ends of the non-display surface by the first blending surface and the second blending surface respectively, and a first groove and a second groove are provided in the two ends of the non-display surface respectively; and wherein the display panel comprises:

a substrate comprising a display area, a first non-display area, and a second non-display area, and he first non-display area and the second non-display area are located on edges of the two ends of the display area disposed oppositely, respectively;

a display element layer disposed on the display area;

a plurality of barrier walls disposed on the first non-display area and the second non-display area;

an encapsulation layer covering the display area, and extending to the barrier walls and to cover the barrier walls; and at least two blocking portions disposed on the first non-display area and the non-second display area, and disposed close to the edges of the display panel;

wherein the first non-display area and the second non-display area are disposed in the first groove and the second groove of the terminal main body respectively, and the display area covers the display area, the first blending surface and the second blending surface of the terminal main body.

In some embodiments of the present application, in the first non-display area and the second non-display area, a linear distance between an edge of the encapsulation layer and the edges of the display panel is 0.1 millimeter to 100 millimeter. The specific values of the linear distances are determined according to the firmness that the first (second) non display area is fixed to the first (second) groove of the non-display surface. Widths of the first non-display area and the second non-display area are elongated so that the first non-display area and the second non-display area can be effectively fixed in the first groove and the second groove respectively. Specifically, in the first non-display area and the second non-display area, the linear distances between the edge of the encapsulation layer and the edges of the display panel are elongated by 1 micron to 100 millimeters, which is convenient for operating.

In some embodiments of the present application, the substrate comprises a flexible substrate.

In some embodiments of the present application, the substrate further comprises a thin film transistor array layer stacked on a surface of the flexible substrate.

In some embodiments of the present application, the display element layer comprises a first electrode layer, an organic light-emitting diode (OLED) display device layer, and a second electrode layer disposed sequentially, and the first electrode layer is disposed on the substrate.

In some embodiments of the present application, the OLED display device layer comprises a plurality of OLED display devices disposed at interval.

In some embodiments of the present application, the OLED display device comprises a hole injection layer, a hole transport layer, a light-emitting layer, an electron transport layer and an electron injection layer disposed sequentially.

In some embodiments of the present application, a pixel definition dam is disposed between two adjacent OLED display devices.

In some embodiments of the present application, the encapsulation layer comprises a first inorganic layer, an organic layer and a second inorganic layer, and the first inorganic layer is stacked on the second electrode layer.

In some embodiments of the present application, a blocking portion is disposed on each of the first non-display area and the second non-display area.

In some embodiments of the present application, there is a fixed interval between the blocking portion and the barrier walls.

In some embodiments of the present application, the blocking portion is close to the edge of the display panel.

A foldable display terminal is provided by the embodiments of the present application. The display terminal is a planar display device. When the display terminal is in a unfolded state, the display surface, the first blending surface and the second blending surface fully cover all display areas of the display panel. Namely, the display panel effectively cover the edges of both ends of the display terminal and the end corners of both ends of the display terminal to fulfill bezel-free display in both ends.

When the display terminal is in the folded state, the display surface, the first blending surface, and the second blending surface connect to form an encircling body. As the display area has full coverage of an outer surface of the encircling body. And the first non-display area and the second non-display area are hidden inside the display terminal, so that a seamless surround display effect can be fulfilled. The side parts of the first blending surface and the second blending surface face are connected to each other and the side parts where the bending portions locate can perform bezel-free display. The whole encircling body can display a same content, or each surface of the encircling body displays different contents, or only one in all surfaces of the encircling body displays content.

A display panel applied in the display terminal is also provided. The display panel is a flexible display panel, the first non-display area and the second non-display area can be effectively fixed on the terminal main body by elongating the width of the first non-display area and the second non-display area, peeling off from the terminal main body of the first non-display area and the second non-display area can be effectively avoided, which ensuring a seamless surround display effect and a bezel-free display effect on both sides of the display terminal in the folded state, and a bezel-free display effect on both sides of the display terminal in the unfolded state.

DETAILED DESCRIPTION OF EMBODIMENTS

The foregoing objects, features and advantages adopted by the present application can be best understood by referring to the following detailed description of the preferred embodiments and the accompanying drawings. Furthermore, the directional terms described in the present invention, such as upper, lower, front, rear, left, right, inner, outer, side, etc., are only directions referring to the accompanying drawings. Therefore, the used directional terms are used to describe and understand the present invention, but the present application is not limited thereto.

Figure 6:
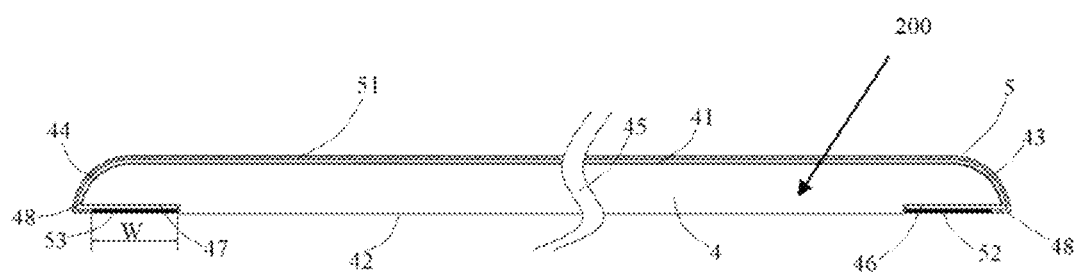
FIG. 6 is a cross-sectional schematic diagram of a display terminal in a unfolded state provided by the embodiments of the present application.

In a first aspect, a display terminal 200 is provided by embodiments of the present application. The display terminal 200 can be a flat display device, for example, a mobile phone, a tablet computer, etc. As shown in FIG. 6, the display terminal 200 is in a unfolded state, and the display terminal 200 includes:

a terminal main body 4, including a display surface 41 and a non-display surface 42 disposed oppositely, and a first blending surface 43 and a second blending surface 44 disposed oppositely, wherein a bending portion 45 is configured in each of the display surface 41 and the non-display surface 45, two ends of the display surface 41 are connected to two ends of the non-display surface 42 by the first blending surface 43 and the second blending surface 44 respectively, and a first groove 46 and a second groove 47 are defined in two ends of the non-display surface 42 respectively; and a display panel 5 including a display area 51, a first non-display area 52, and a second non-display area 53 located on the edges of both ends of the display area 51 disposed oppositely, wherein the first non-display area 52 and the second non-display area 53 are disposed in the first groove 46 and the second groove 47 respectively, and the display area 51 covers the display area 41, the first blending surface 43, and the second blending surface 44.

Figure 1:
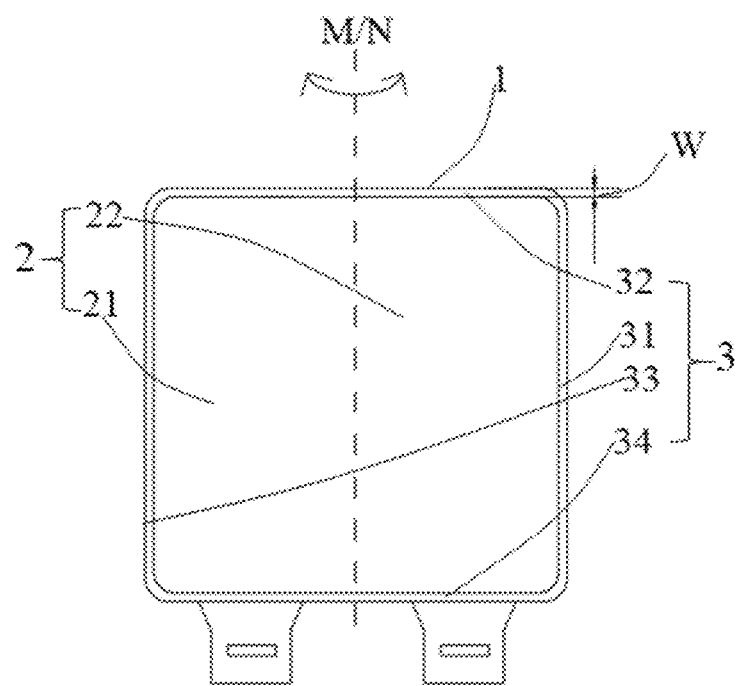
FIG. 1 is a structural schematic diagram of a flexible OLED display panel in prior art.
Figure 2:
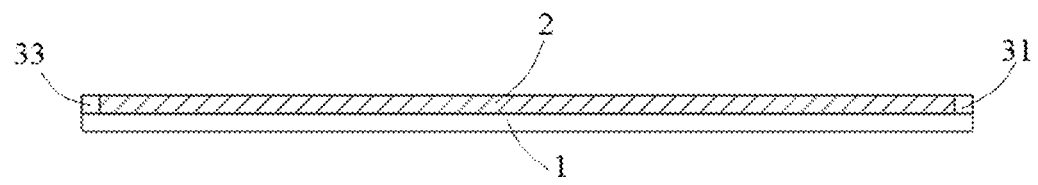
FIG. 2 is a cross-sectional schematic diagram of FIG. 1 in a horizontal direction perpendicular to M/N.
Figure 3:
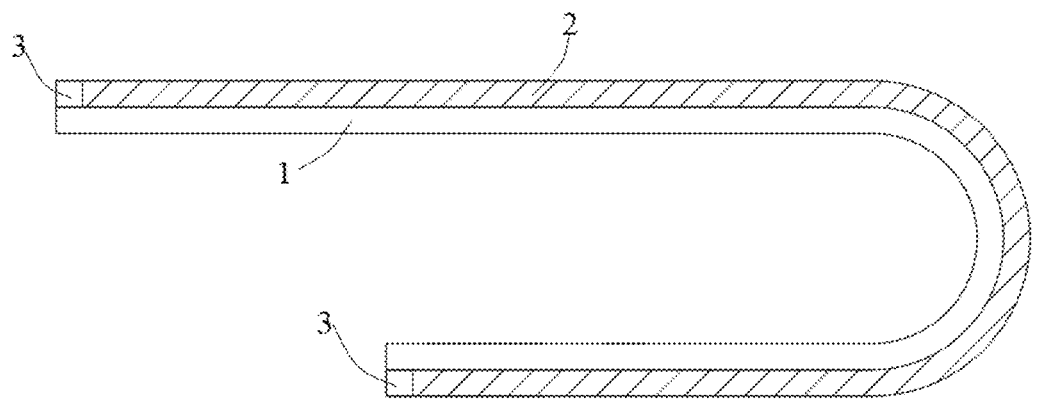
FIG. 3 is a structural schematic diagram of a first application of the flexible OLED display panel in terminal products in prior art.
Figure 4:
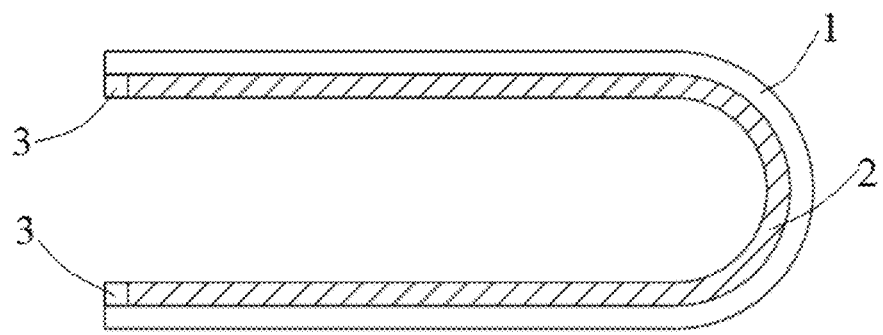
FIG. 4 is a structural schematic diagram of a second application of the flexible OLED display panel in terminal products in prior art.
Figure 5:
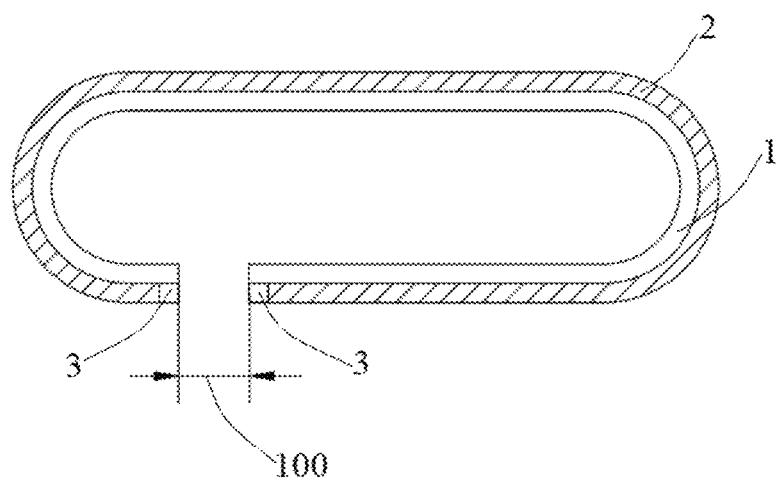
FIG. 5 is a structural schematic diagram of a third application of the flexible OLED display panel in terminal products in prior art.

Specifically, the display area 51 is fully surrounded by the non-display areas (as shown in prior art of FIG. 0.1), but only two non-display areas disposed oppositely are selected to be disposed inside the first groove 46 and the second groove 47. Namely, two side parts of the display terminal 200 perform bezel-free display. Referring to FIG. 1, the first non-display area 52 and the second non-display area 53 of the embodiments of the present application can be a first non-display sub-area 31 and a third non-display sub-area 33 disposed oppositely and can also be a second non-display sub-area 32 and a fourth non-display sub-area 34 disposed oppositely.

In some embodiments, compared with prior art, widths of the first non-display area 52 and the second non-display area 53 are elongated so that the first non-display area 52 and the second non-display area 53 can be effectively fixed in the first groove 46 and the second groove 47 respectively to avoid peeling.

For example, in prior art, the non-display area of the large-size foldable display panel has a width of at least 1.0 millimeter. However, the non-display area of regular non-foldable display panel usually has a width of 1.0 millimeter to 1.5 millimeters. In the embodiments of the present application, widths of the first non-display area 52 and the second non-display area 53 are identical, which are both 1 nanometer to 100 millimeters greater than the width of the non-display area of the large-size foldable display panel in prior art.

In some embodiments, the bending portions 45 are configured in the middle of the display surface 41 and the middle of the non-display surface 42 to optimize the screen-to-body ratio of the display terminal 200.

In some embodiments, the first blending surface 43 and the second blending surface 44 are symmetrical to the bending portion 45, and the first groove 46 and the second groove 47 are symmetrical to the bending portion 45 to optimize the screen-to-body ratio of the display terminal 200.

In some embodiments, both the first blending surface 43 and the second blending surface 44 are arc surfaces, which is beneficial to the seamless connection of the first blending surface 43 and the second blending surface 44.

Figure 7:
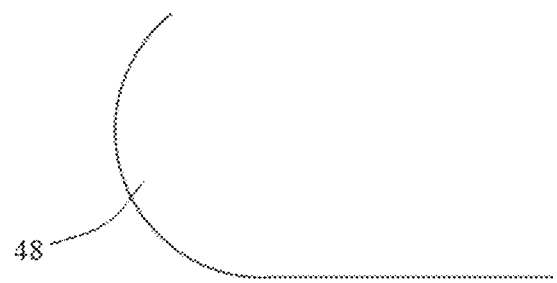
FIG. 7 is a structural schematic diagram of an end corner of the display terminal in a unfolded state provided by embodiments of the present application.

In some embodiments, an end corner 48 at the junction of the non-display surface 42 and the first blending surface 43 and an end corner 48 at the junction of the non-display surface 42 and the second blending surface 44 are rounded corners to prevent sharp edges and corners from hurting the display panel itself, people, or objects. For example, the end corner 48 can be the rounded corner shown in FIG. 7.

In some embodiments, a depth of the first groove 46 equals a depth of the second groove 47, and both the depth of the first groove 46 and the depth of the second groove 47 are less than an overall thickness of the display terminal 4. In some embodiments, both the depth of the first groove 46 and the depth of the second groove 47 are at least greater than the overall thickness of the display panel 5.

In some embodiments, the display area 51 extends from the first blending surface 43 and the second blending surface 44 to close to an edge of the first groove 46 and an edge of the second groove 47, which is beneficial to achieving a seamless surround display effect, while effectively avoiding a large overlap between the display area 51 covering the first blending surface 43 and the display area 51 covering the second blending surface 44, thereby avoiding problems of significant heat generation and significant temperature rise which the large overlap causes the display panel in the overlapping area due to.

In some embodiments, the width of the first non-display area and the width of the second non-display area are identical, but there are no specifical limitations on sizes of the first non-display area and the second non-display area, and they can be selected according to actual needs. In addition, there are no specifical limitations on a size of the display area either, and it can be selected according to actual needs.

As shown in FIG. 6, when the display terminal 200 is in the unfolded state, the display surface 41, the first blending surface 43, and the second blending surface 44 fully covers the display area 51, and the display area 51 effectively covers the left edge and its end corner 48 of the display terminal 200 and the right edge and its end corner 48, so that each of the left and right side of the display terminal performs bezel-free display.

Figure 8:
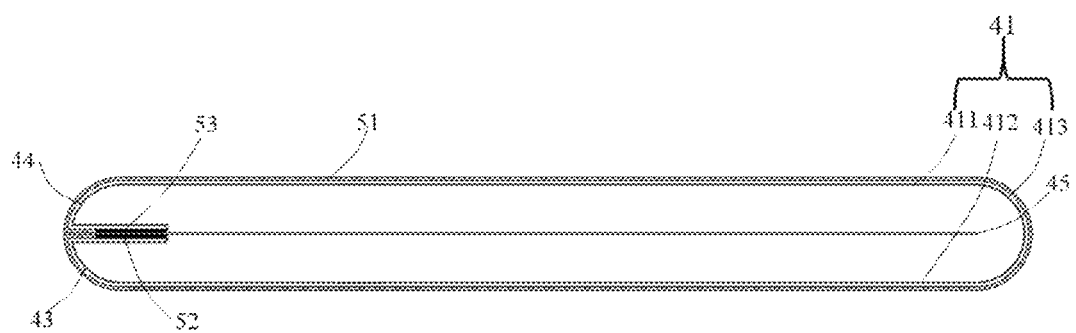
FIG. 8 is a cross-sectional schematic diagram of the display terminal in a folded state provided by embodiments of the present application.

As shown in FIG. 8, when the display terminal 200 is in the folded state, the first blending surface 43 and the second blending surface 44 face are connected to each other so that the display surface 41, the first blending surface 43, and the second blending surface 44 connect to form an encircling body. The display surface 41 is divided into a first display surface 411, a second display surface 412, and a third display surface 413. Wherein, the first display surface 411 is located on an upper surface of the display terminal, the second display surface 412 is located on a bottom surface of the display terminal 200, the third display surface 413 is located on a right side surface of the display terminal 200 (i.e., located on the bending portion 45). As the display area 51 fully covers an outer surface of the encircling body, i.e., the display area 51 has full coverage of the outer side of the first display surface 411, a second display surface 412, a third display surface 413, the first blending surface 43 and the second blending surface 44. In addition, as the first non-display area 52 and the second non-display area 53 are hidden inside the display terminal 200, a seamless surround display effect can be fulfilled. Moreover, each of the left and right sides of the display terminal 200 can perform bezel-free display. The whole encircling body can display same content, each surface of the encircling body displays different content, or only one in all surfaces of the encircling body displays content.

It should be noted that regular technical means in the art can be used to manufacture the display terminal and will not be repeated here.

Figure 9:
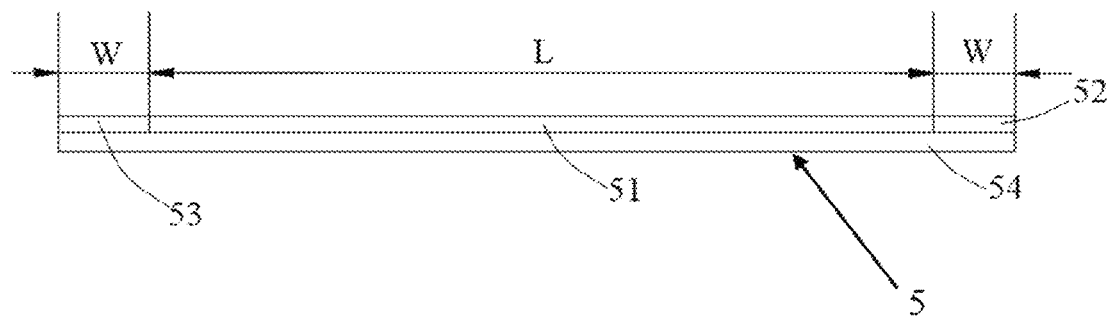
FIG. 9 is a cross-sectional schematic diagram of a display panel provided by embodiments of the present application.
Figure 10:
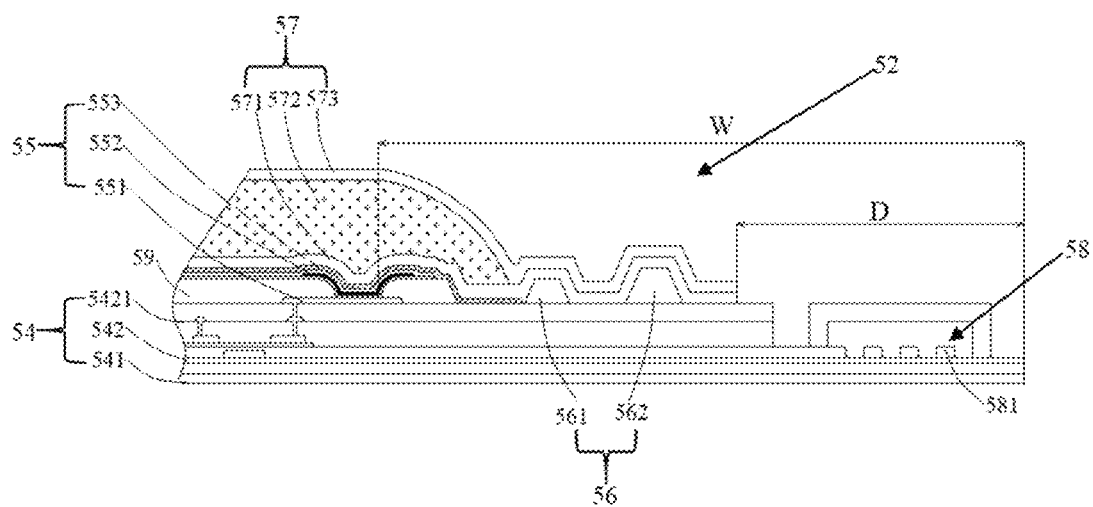
FIG. 10 is a partial cross-sectional schematic diagram of the display panel including a first non-display area provided by embodiments of the present application.

In a second aspect, a display panel is also provided by embodiments of the present application, which can be applied in the display terminal of the first aspect. As shown in FIG. 9 and FIG. 10, the display panel 5 includes:
 a substrate 54 including a display area 51, a first non-display area 52, and a second non-display area 53, and the first non-display area 52 and the second non-display area 53 are located on edges of two ends of the display area 51 disposed oppositely respectively;
 a display element layer 55 disposed on the display area 51;
 a plurality of barrier walls 56 disposed on the first non-display area 52 and the second non-display area 53;
 an encapsulation layer 57 covering the display area 51 and extending to the barrier walls 56 to cover the barrier walls 56; and
 at least two blocking portions 58 disposed on each of the first non-display area 52 and the second non-display area 53 and disposed close to the edges of the display panel 5.

Specifically, the width of the first non-display area 52 refers to a linear distance from a right edge of the display element layer 55 to a corresponding right edge of the display panel 5, which corresponds to the reference number W in FIG. 9 and FIG. 10. For the same reason, the width of the second non-display area 53 refers to a linear distance from a left edge of the display element layer 55 to a corresponding left edge of the display panel 5. The width of the second non-display area 53 equals to the width of the first non-display area 52. A cross-sectional length of the display area 51 refers to a linear distance from a left edge to a right edge of the display element layer 55, which corresponds to the reference number L in FIG. 9.

In some embodiments, in the first non-display area and the second non-display area, a linear distance between an edge of the encapsulation layer and edges of the display panel is 0.1 millimeter to 100 millimeters, which corresponds to the reference number D in FIG. 10.

In some embodiments, the substrate 54 includes a flexible substrate 541, which can be made of polymer materials, for example, polyimide (PI), polyethersulfone (PES), polycarbonate (PC), polyethylene terephthalate (PET), polyethylene naphthalate (PEN), polyaryl compounds (PAR), or glass fiber reinforced plastics (FRP), etc. PI is preferred as the material of the flexible substrate 541 in the embodiments of the present application.

Furthermore, the substrate 54 further includes a thin film transistor (TFT) array layer 542, which is stacked on one surface of the flexible substrate. The TFT array layer 542 includes a planarization layer 5421, which can have a single layer structure or a multi-layer structure. Preferably, the planarization layer 5421 described in the embodiments of the present application has a double-layer structure, and the planarization layer 5421 is discontinuous, i.e., two planarization layers 5421 arranged at interval, one of which is close to the edge of the display panel 5.

In some embodiments, the display element layer 55 includes a first electrode layer 551, an organic light-emitting diode (OLED) display device layer 552, and a second electrode layer 553 disposed sequentially, and the first electrode layer 552 includes a plurality of OLED display devices disposed at interval. Namely, the display panel 5 is an OLED display panel. The first electrode layer 551 is disposed on the substrate 54, preferably, the first electrode layer 551 has a patterned array structure. Each of the OLED display device includes a hole injection layer, a hole transport layer, a light-emitting layer, an electron transport layer, and an electron injection layer disposed sequentially.

A pixel definition dam 59 is disposed between two adjacent OLED display devices. A material of the pixel definition dam 59 is organic photoresist. The entire surface of the second electrode layer 553 covers the OLED display device layer 552 and all of the pixel defining dam 59, and an edge of the second electrode layer 553 is limited by the barrier walls 56.

It should be noted that one of the first electrode layer 551 and the second electrode layer 553 is an anode layer and the other one is a cathode layer. Preferably, the first electrode layer 551 is the anode layer and the second electrode layer 553 is the cathode layer. Each of the first electrode layer 551 and the second electrode layer 553 includes a transparent conductive film, the transparent conductive film can be made of indium tin oxide (ITO) film, aluminum doped zinc oxide thin film, carbon nanotube transparent conductive film, tin oxide transparent conductive film etc. Preferably, the first electrode layer 551 is a thin film structure consisting of a first ITO layer, a silver (Ag) layer, and a second ITO layer.

In some embodiments, a first barrier wall 561 and a second barrier wall 562 are provided in the first non-display area 52 and the second non-display area 53, respectively. The first barrier wall 561 is close to the display area 51. Each of the cross-section of the first barrier wall 561 and the second barrier wall 562 has a shape of isosceles trapezoid, and a height of the cross-section of the second barrier wall 562 is greater than a height of the cross-section of the first barrier wall 561. Preferably, a material of the first barrier wall 561 and the second barrier wall 562 is an organic photoresist. It should be noted that an edge of the second electrode layer 553 does not exceed the first barrier wall 561.

In some embodiments, the encapsulation layer 57 includes a first inorganic layer 571, an organic layer 572, and a second inorganic layer 573 arranged in sequence. The first inorganic layer 571 is stacked on the second electrode layer 553, and the first inorganic layer 571 and the second inorganic layer 573 extend through the display area 51 to cover the barrier walls 56. The advance formation of the barrier wall 56s has a function of blocking the encapsulation layer 57. Each of the materials of the first inorganic layer 571 and the second inorganic layer 573 is at least one of silicon nitride ($SiN_x$), silicon oxide ($SiO_x$), and aluminum oxide ($Al_2O_3$), and a material of the organic layer 572 is at least one of polymethylmethacrylate and hexamethyldimethylsiloxane.

In some embodiments, a blocking portion 58 is configured on each of the first non-display area 52 and the second non-display area 53. The blocking portion 58 is close to the edge of the display panel, and there is a fixed interval between the blocking portion 58 and the barrier walls 56 to prevent a cutting crack at the edge of the display panel 5 from spreading to the display area 51. The blocking portion 58 includes a barrier layer 581 and a second planarization layer 5421 arranged in sequence, and the barrier layer 581 is disposed on the flexible substrate. The barrier layer 581 includes a plurality of barrier columns arranged at interval, and a material of the barrier columns is inorganic compound, for example, silicon nitride ($SiN_x$), silicon oxide ($SiO_x$), etc.

It should be noted that regular technical means in the art can be used to manufacture the display terminal and will not be repeated here.

According to the display panel 5 provided by the embodiments of the present application, the first non-display area 52 and the second non-display area 53 can be effectively fixed on the terminal main body 4 by elongating the width of the first non-display area 52 and the second non-display area 53, peeling off from the terminal main body 4 of the first non-display area 52 and the second non-display area 53 can be effectively avoided, which ensuring a seamless surround display effect and a bezel-free display effect on both sides of the display terminal 200 in the folded state, and a bezel-free display effect on both sides of the display terminal 200 in the unfolded state, namely, the non-display edges of the display panel are hidden, so as to fulfil a bezel-free display effect in two edges of the terminal. The present application has been described by the above-mentioned related embodiments; however, the above-mentioned embodiments are only examples of the implementation of the present invention. It must be pointed out that the disclosed embodiments do not limit the scope of the present application. On the contrary, the spirit and scope of the claims and the modification and equalization are all included in the scope of the present application.

What is claimed is:

1. A display terminal, comprising an unfolded state and a folded state, the display terminal comprising:
   a terminal main body comprising a display surface, a non-display surface, a first blending surface, and a second blending surface, wherein in the unfolded state, the display surface is positioned opposite to the non-display surface, the first blending surface and the second blending surface are disposed oppositely, a bending portion which is bendable is correspondingly configured in each of the display surface and the non-display surface, two ends of the display surface are connected with two ends of the non-display surface by the first blending surface and the second blending surface respectively, and a first groove and a second groove are provided at the two ends of the non-display surface respectively; and in both the unfolded state and the folded state, the first groove and the second groove are arranged under the display surface; and
   a display panel comprising a display area and a first non-display area and a second non-display area located on edges of both ends of the display area disposed oppositely, wherein the first non-display area and the second non-display area are disposed in the first groove and the second groove of the terminal main body respectively, and the display area covers the display surface, the first blending surface, and the second blending surface of the terminal main body;
   wherein the first blending surface forms an end corner with the non-display surface, and the second blending surface forms an end corner with the non-display surface; and each of the end corners has a same angle in both the unfolded state and the folded state.

2. The display terminal according to claim 1, wherein the bending portions are configured in the middle of the display surface and the middle of the non-display surface.

3. The display terminal according to claim 2, wherein the first blending surface and the second blending surface are symmetrical to the bending portion, and the first groove and the second groove are symmetrical to the bending portion.

4. The display terminal according to claim 1, wherein both the first blending surface and the second blending surface are arc surfaces.

5. The display terminal according to claim 1, wherein the end corner at the junction of the non-display surface and the first blending surface and the end corner at the junction of the non-display surface and the second blending surface are rounded corners.

6. The display terminal according to claim 1, wherein the display area of the display panel extends from the first blending surface and the second blending surface to close to an edge of the first groove and an edge of the second groove.

7. The display terminal according to claim 1, wherein a depth of the first groove equals a depth of the second groove, and both the depth of the first groove and the depth of the second groove are less than an overall thickness of the display terminal.

8. The display terminal according to claim 7, wherein both the depth of the first groove and the depth of the second groove are at least greater than an overall thickness of the display panel.

9. A display device with a display terminal comprising an unfolded state and a folded state, wherein the display terminal comprises a terminal main body comprising:

a display surface, a non-display surface, a first blending surface, and a second blending surface, wherein in the unfolded state, the display surface is positioned opposite to the non-display surface, the first blending surface and the second blending surface are disposed oppositely, a bending portion which is bendable is correspondingly configured in each of the display surface and the non-display surface, two ends of the display surface are connected with two ends of the non-display surface by the first blending surface and the second blending surface respectively, and a first groove and a second groove are provided at the two ends of the non-display surface respectively; and in in both the unfolded state and the folded state, the first groove and the second groove are arranged under the display surface; and wherein the display panel comprises:

a substrate comprising a display area, a first non-display area, and a second non-display area, and the first non-display area and the second non-display area are located on edges of the two ends of the display area disposed oppositely, respectively;

a display element layer disposed on the display area;

a plurality of barrier walls disposed on the first non-display area and the second non-display area;

an encapsulation layer covering the display area and extending to the barrier walls and to cover the barrier walls; and at least two blocking portions disposed on the first non-display area and the non-second display area, and disposed close to the edges of the display panel;

wherein, the first non-display area and the second non-display area are disposed in the first groove and the second groove of the terminal main body respectively, and the display area covers the display surface, the first blending surface, and the second blending surface of the terminal main body;

wherein the first blending surface forms an end corner with the non-display surface, and the second blending surface forms an end corner with the non-display surface; and each of the end corners has a same angle in both the unfolded state and the folded state.

10. The display device according to claim 9, wherein in the first non-display area and the second non-display area, a linear distance between an edge of the encapsulation layer and the edges of the display panel is 0.1 millimeter to 100 millimeters.

11. The display device of claim 9, wherein the substrate comprises a flexible substrate.

12. The display device of claim 11, wherein the substrate further comprises a thin film transistor array layer stacked on a surface of the flexible substrate.

13. The display device of claim 9, wherein the display element layer comprises a first electrode layer, an organic light-emitting diode (OLED) display device layer, and a second electrode layer disposed sequentially, and the first electrode layer is disposed on the substrate.

14. The display device of claim 13, wherein the OLED display device layer comprises a plurality of OLED display devices disposed at interval.

15. The display device of claim 14, wherein the OLED display device comprises a hole injection layer, a hole transport layer, a light-emitting layer, an electron transport layer, and an electron injection layer disposed sequentially.

16. The display device of claim 14, wherein a pixel definition dam is disposed between two adjacent OLED display devices.

17. The display device of claim 13, wherein the encapsulation layer comprises a first inorganic layer, an organic layer, and a second inorganic layer, and the first inorganic layer is stacked on the second electrode layer.

18. The display device according to claim 9, wherein a blocking portion is disposed on each of the first non-display area and the second non-display area.

19. The display device of claim 18, wherein there is a fixed interval between the blocking portion and the barrier walls.

20. The display device of claim 18, wherein the blocking portion is close to the edges of the display panel.

\* \* \* \* \*